United States Patent [19]
Simonelli

[11] Patent Number: 5,272,433
[45] Date of Patent: Dec. 21, 1993

[54] POLARMETRIC ELECTRIC FIELD SENSOR WITH ELECTRO-OPTICAL CRYSTAL CUT DISPOSED TO MEASURE ELECTRIC FIELD DIRECTION

[75] Inventor: Francesco Simonelli, Florence, Italy
[73] Assignee: Pirelli Cavy S.p.A., Milan, Italy
[21] Appl. No.: 703,018
[22] Filed: May 20, 1991
[51] Int. Cl.$^5$ .............................................. G01D 5/34
[52] U.S. Cl. ................... 324/96; 324/244.1; 359/281
[58] Field of Search ............ 324/244.1, 96; 359/281, 359/283; 250/231.1

[56] References Cited

U.S. PATENT DOCUMENTS

| | | | |
|---|---|---|---|
| 4,604,577 | 8/1986 | Matsumura et al. | 324/244.1 |
| 4,631,402 | 12/1986 | Nagatsuma et al. | 324/96 |
| 4,896,103 | 1/1990 | Shimanuki et al. | 324/244.1 |

FOREIGN PATENT DOCUMENTS

| | | |
|---|---|---|
| 0393382 | 10/1990 | European Pat. Off. |
| 0453693 | 10/1991 | European Pat. Off. |
| 59-99761 | 6/1983 | Japan |
| 62-47560 | 3/1987 | Japan |

OTHER PUBLICATIONS

Lo et al. "Proposal for 3-Dimensional . . . probing" Applied Physics Letters Jun. 1987 No. 25 pp. 1791–1793.
Hidaka et al. "Simultaneous measurement . . . " Review of Scientific Instruments No. 7 Jul. 1989 pp. 1252–1257.
Massey et al "Electromagnetic Field Components . . . " Applied Optics vol. 14, No. 11, Nov. 1, 1975 pp. 2712–2719.
Bohnert et al. "Fiber Optic Sensing of Electric Field Components" Applied Optics No. 23 Dec. 1981 pp. 4814–4818.
Shibata, "A fiber optic electric field sensor . . . " Apr. 1983 Proc. of the First International Conference on Optical Fiber Sensor pp. 164–168.

Primary Examiner—Walter E. Snow
Attorney, Agent, or Firm—Brooks Haidt Haffner & Delahunty

[57] ABSTRACT

A polarimetric directional field sensor comprises an emitter and receiver (1) of measurement signals, connected by optical fibers (2, 2a, 2b) to a portable probe (3). The probe (3) comprises an optical element (11, 13) sensitive to the field to be measured and means (9, 20) for polarizing the measurement signal. The optically sensitive element (11, 13) is in the form of a birefringent crystal having a crystalline structure which provides at least one plane in which the induced birefringence is modified by a single component of the field to be measured. The crystal is cut and oriented in the probe so that the direction of propagation of the optical measurement signal inside the crystal is normal to this plane, the polarizing means (9, 20) being oriented at 45° to the orthogonal axes in which the crystal's refractive indices are modified by the desired component of the field.

21 Claims, 2 Drawing Sheets

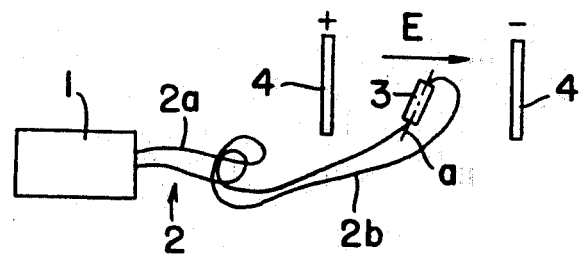
FIG. 1
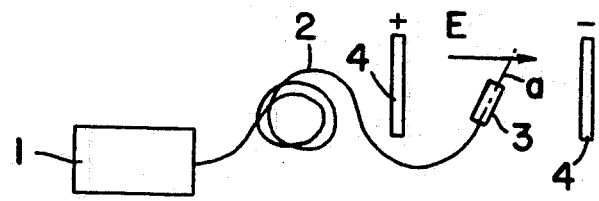
FIG. 2
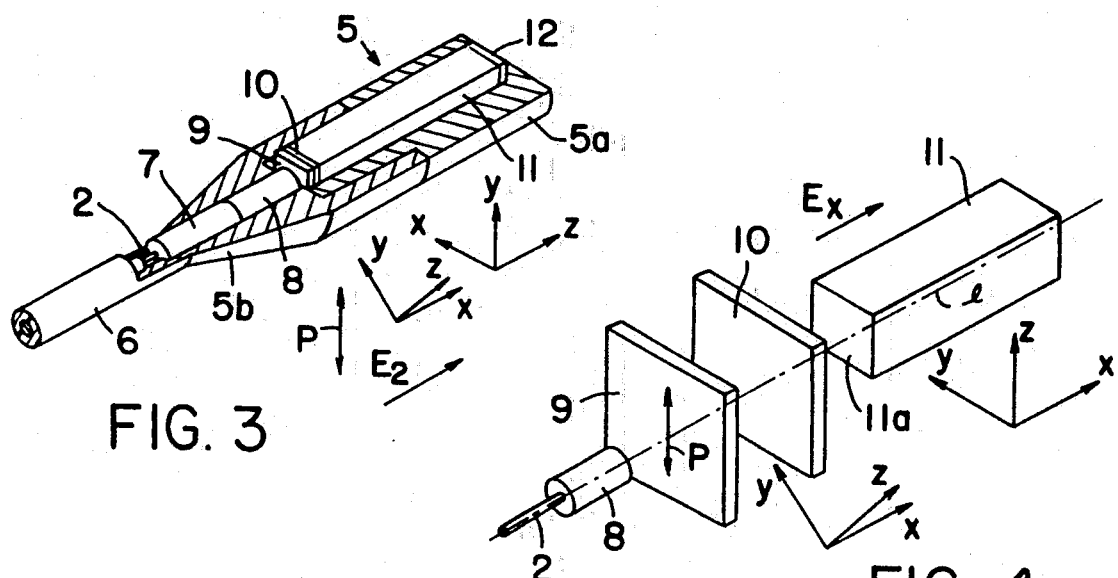
FIG. 3
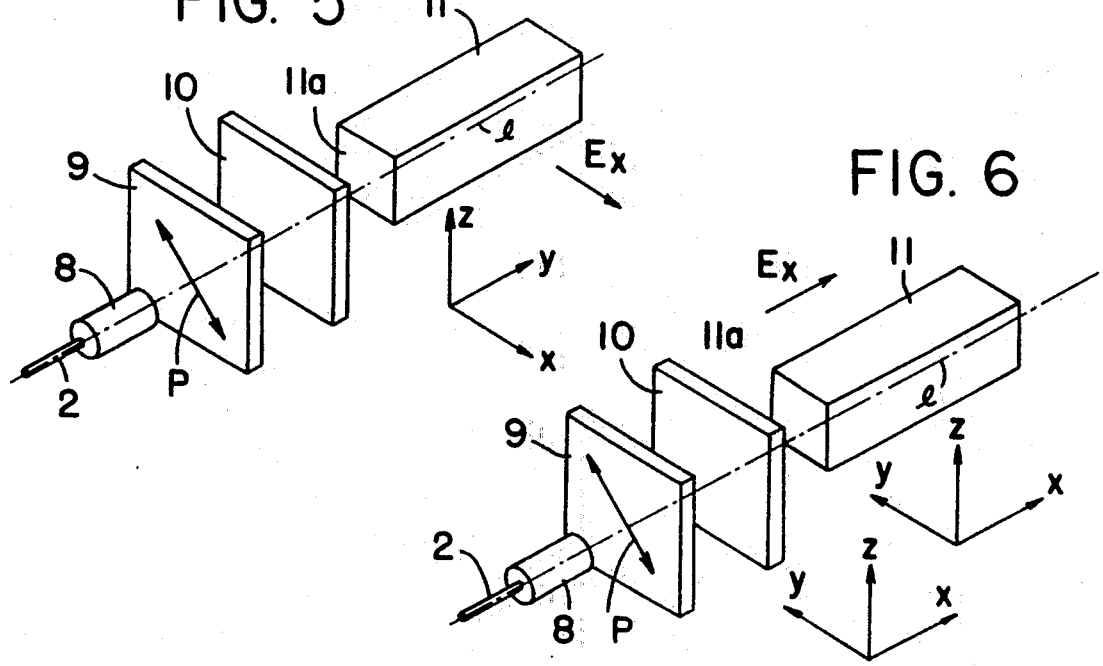
FIG. 4
FIG. 5
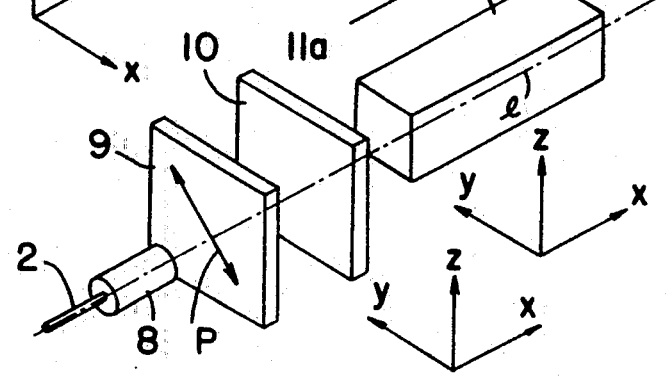
FIG. 6

POLARMETRIC ELECTRIC FIELD SENSOR WITH ELECTRO-OPTICAL CRYSTAL CUT DISPOSED TO MEASURE ELECTRIC FIELD DIRECTION

FIELD OF THE INVENTION

The present invention relates to a polarimetric field sensor. For the measurement of fields, particularly electric or magnetic fields, polarimetric optical sensors may be used. Such sensors exploit the changes in the state of polarization in birefringent crystals of an optical signal transmitted through them.

BACKGROUND OF THE INVENTION

Such sensors are especially useful because the sensitive element, or probe, can be very small and can be made from dielectric material, so that the field is not affected and safety is not compromised in the presence of high-voltage conductors or the like.

Known sensors, on the other hand, although being sufficiently accurate in measuring field intensity at the point where the probe is located, are not capable of providing adequate information about the direction of the field, that is, they are not capable of detecting and of providing information about the intensity of the field in one or more directions relative to the position of the probe.

While it is possible, from the measured value and following an appropriate calibration, to obtain the actual distribution of the field in the case of a well-defined field configuration and for a given location of the probe, in the case of a substantially unknown field configuration, such as in the proximity of a charged body having an irregular shape or with an irregular charge distribution, the sensor does not provide sufficient information to define the field.

It would therefore be desirable to provide a directional sensor capable of detecting at least one component of a field to be measured in a well-defined direction, without such measurement being influenced by the other components of the field.

OBJECT OF THE INVENTION

The object of the present invention is thus to identify the characteristics of a sensor capable of accomplishing such directional measurement, for one or more components of a field to be measured.

SUMMARY OF THE INVENTION

According to the present invention there is provided a polarimetric directional field sensor comprising a measurement signal emitter a measurement signal receiver, a manoeuvrable probe, optical fibers connecting the probe to the emitter and to the receiver, wherein the probe comprises an optically sensitive element for modifying the state of polarization of an optical signal transmitted therethrough in the presence of a field to be measured and means for polarizing the measurement signal, characterized in that the optically sensitive element comprises an electro-optical crystal having a crystalline structure which provides a plane in which the change of the refraction characteristics along two orthogonal axes lying therewithin is caused to be determined by a single component of the field, the element being cut and oriented in the probe so that the direction of propagation of the measurement signal therein is normal to said plane and the polarizing means being oriented at 45° to the orthogonal axes in which the crystal's refractive indices are modified by the desired component of the field.

Preferably, the electro-optical crystal is selected from the following:
monoclinic: class 2 y-cut, z-cut;
orthorhombic: class 222 x-cut, y-cut, z-cut and class 2 mm z-cut;
tetragonal: class 4 z-cut, class $\bar{4}$ z-cut, class 422 x-cut and y-cut, class 4 mm z-cut, class $\bar{4}2$ m x-cut, y-cut or z-cut;
rhombohedral: class 32 x-cut;
hexagonal: class 622 x-cut or y-cut, class $\bar{6}$ m2 x-cut or y-cut;
cubic; class $\bar{4}3$ m x-cut, y-cut or z-cut and class 23 x-cut, y-cut or z-cut,
with the corresponding cutting plane oriented orthogonally to the direction of propagation of the optical measurement signal inside the crystal.

The electro-optical crystal is preferably selected from the group comprising: $Ca_2Nb_2O_7$; $KNa(C_4H_4O_6).4H_2O$; $LiB_3O_5$, $KB_5O_8.4H_2O$ and isomorphous compounds; $BaTiO_3$; $KH_2PO_4$ and isomorphous compounds; $SiO_2$; $GaSe$; $\alpha$-$ZnS$; $CdS$; $CdSe$; $Bi_{12}GeO_{2}O$ and isomorphous compounds; $Bi_4Ge_3O_{12}$ and isomorphous compounds; $CdTe$; $GaAs$; $GaP$; $\beta$-$ZnS$; $ZnTe$; $CuCl$; $CuBr$.

In a preferred embodiment the crystal is a cubic crystal of class $\bar{4}3$ m or class 23, x-cut, y-cut or z-cut, having a direction of propagation of the signal which is parallel to the x-axis and the polarizer is arranged with its polarization plane oriented in a direction parallel to the y- or z-axes of the crystal, the sensor being sensitive to the x-component ($E_x$) of the field parallel to the direction of propagation of the light in the crystal.

In an alternative embodiment the crystal is a hexagonal crystal $\bar{6}$ m2, with m $\perp$ y, y-cut, and the polarizer is arranged with the polarization axis oriented at 45° to the x- and y-axes of the crystal, the sensor being sensitive to the x-component ($E_x$) of the field normal to the direction of propagation of the light in the crystal.

According to a further embodiment, the crystal is a rhombohedral crystal 32 x-cut, or hexagonal $\bar{6}$ m2, with m $\perp$ y, x-cut, and the polarizer is arranged with the axis of polarization at 45° to the y- and z-axes of the crystal, the sensor being sensitive to the x-component ($E_x$) of the field parallel to the direction of propagation of the light in the crystal.

The sensor comprises a casing inside which is housed the end of at least one optical fiber aligned with at least one means for collimation, a polarizer and an electro-optical crystal having, on the face opposite that facing the optical fiber means for reflecting an optical signal transmitted through the optical fiber.

According to one embodiment the probe comprises an electro-optical crystal having a crystalline structure which provides three incident planes in each of which the change of the refraction characteristics, according to two orthogonal axes lying in the plane, is caused to be determined by a single component of the field, independent of the other components of the field, and means for transmitting into the crystal and for receiving therefrom it at least two independent optical measurement signals, the directions of propagation of which are normal to respective ones of said planes.

In this embodiment, preferably the electro-optical crystal is selected from crystals:
cubic: classes $\bar{4}3$ m and 23 x-cut, y-cut, z-cut;

orthonormal: class 222 x-cut, y-cut, z-cut;

tetragonal: class $\bar{4}2$ m x-cut, y-cut, z-cut;

with the corresponding cutting planes oriented orthogonally to the direction of propagation of the optical measurement signal inside the crystal.

A cubic crystal of the class $\bar{4}3$ m or 23 is especially preferred. In the case where several optical measurement signals are transmitted into the birefringent crystals, the probe comprises a casing inside which are housed the ends of at least two optical fibers, with respective means of collimation, one of which fibers is oriented orthogonally to one of the cutting faces of the electro-optical crystal and the other fiber or fibers are parallel to the one fiber and aligned with respective prisms for deviating the optical signals transmitted thereby towards the corresponding faces of the crystal, the three faces of the crystal to which the optical signals are directed being mutually orthogonal.

The probe comprises a delay plate, made from birefringent material, which is positioned in the path of the optical measurement signal and arranged for imparting a constant predetermined phase shift between two orthogonal polarizations of the optical measurement signal, the delay plate being oriented with its optical birefringence axes substantially at 45° to the plane of polarization.

The delay plate may be formed from non-electro-optical birefringent material or, alternatively, from electro-optical birefringent material, oriented so that its birefringence characteristics are changed by the same field component to which the electro-optical crystal is sensitive, and may be selected from crystals:

tetragonal: class 4 and $\bar{4}$, z-cut;

orthorhombic: class 2 mm, z-cut;

rhombohedral: class 32, x-cut;

hexagonal: class $\bar{6}$ m 2, x-cut, y-cut.

Preferably, the material is x-cut quartz.

In a probe which is crystal which has a birefringence induced at 45° to the main optical axes and the optical measurement signal or each optical measurement signal is propagated parallel to the component or to the components of the field to be measured, the delay plate is oriented with the y- and z-axes at 45° to the main optical axes of the birefringent crystal.

In a probe with a crystal which has a birefringence induced along its main optical axes, the delay plate is oriented with the y- and z-axes along the main optical axes of the birefringent crystal.

The cutting plane of the electro-optical crystal has an orientational tolerance of less than 5/10ths of a degree with respect to the prescribed theoretical plane and preferably, less than 6' with respect to the prescribed theoretical plane.

The plane of polarization has an orientational tolerance of less than 1° with respect to the prescribed theoretical plane.

BRIEF DESCRIPTION OF THE DRAWINGS

Greater details may be obtained from the following detailed description of the invention, with reference to the enclosed drawings, in which there are shown:

in FIG. 1 a schematic representation of an electric field transmission, polarimetric sensor in accordance with the present invention;

in FIG. 2 schematic a representation of an electric field reflection, polarimetric sensor in accordance with the present invention;

in FIG. 3 the probe of the sensor of FIG. 2, partially in a cross-sectional view;

in FIG. 4 an exploded view of the elements of the probe of a sensor with the orientation of the components in accordance with a first embodiment of the invention;

in FIG. 5 an exploded view of the elements of the probe of the sensor, with the orientation of the components in accordance with a second embodiment of the invention;

in FIG. 6 an exploded view of the elements of the probe of the sensor with the orientation of the components in accordance with a third embodiment of the invention;

DETAILED DESCRIPTION OF EMBODIMENTS OF THE INVENTION

Figure 8:
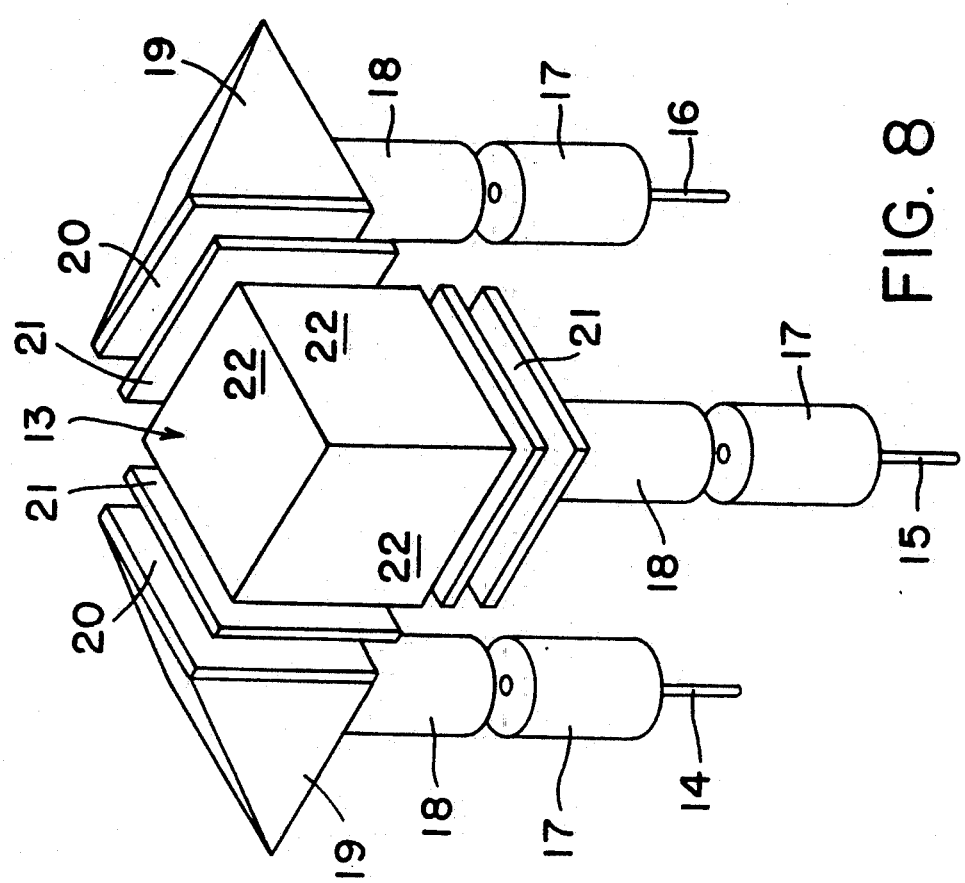
in FIG. 8 a perspective view of the probe sensitive to three components of the field.

As shown in FIG. 1, a polarimetric electric field sensor comprises a device 1 for emitting and receiving an optical measurement signal which is connected by optical fiber 2 to a probe 3, to be positioned in an electric field E generated by external configuration of charged bodies 4.

The device 1 comprises a light source for transmitting an optical signal, via a transmission optical fiber 2a to the probe 3. The optical signal is polarized in the probe by means of a first polarizer and then passes through an electro-optical crystal and a second polarizer and then, into a return fiber 2b.

If the transmission and return fibers 2a, 2b are of the type which maintain the polarization, the polarizers may, alternatively, be remote, that is, located within the device 1 or in any case, at a distance from the probe. Such an arrangement is practicable provided there is no danger that the state of polarization of the signal will be altered by undesirable external effects acting on the fibers which would limit the accuracy of the measurement. Such effects might occur, for example, if the fibers are of considerable length.

As a result of the electro-optical effect, the polarization characteristics of the signal transmitted through the crystal are modified by the electrical field, and the signal is then transmitted, via the return fiber 2b, to the device 1, where changes in intensity of the return signal, arising from changes in the state of polarization introduced by the field, are analysed so that the value of the electric field E may be obtained.

In an alternative embodiment, illustrated in FIG. 2, the probe crystal is provided with a reflective coating at the end face opposite to the face at which the optical signal is introduced.

The signal is transmitted to the probe via an optical fiber 2, polarized by a polarizer, and transmitted through the crystal and reflected. The measurement signal again passes through the crystal and the polarizer in the opposite direction and returns to the device 1 through the same optical fiber 2 in which the signal was transmitted to the probe.

The return signal may be separated within the device 1 and thus analysed in a manner similar to that described above.

As illustrated in FIGS. 1 and 2, the axis a of the probe 3 can be oriented freely with respect to the direction of the electric field E.

In addition, the components of the probe, as discussed below, in turn have an orientation and exhibit an anisotropic behaviour.

An example of the structure of the probe 3 is illustrated in greater detail in FIG. 3 for the case of a probe 5 operating by reflection. It comprises a casing 5, suitably formed by two portions 5a, 5b, to which is connected an optical fiber 2, housed in a corresponding sheath 6.

The end of the fiber 2 is inserted into a supporting ferrule 7 which, in turn, faces a focusing lens 8.

On the other side of the lens 8, there is provided, in sequence, a polarizer 9, a delay plate 10 and a crystal 11 provided with a reflecting coating 12 on its end face.

In order to make the probe sensitive to a single component of the field, the crystal 11 is a directional electro-optical crystal, that is, it has a crystalline structure which provides at least one plane in which the single field component causes a change in the refraction characteristics along two orthogonal axes lying in the plane.

Such a crystal is, moreover, cut and oriented inside the probe so that the direction of the propagation of the measurement signal inside it, as indicated in FIGS. 4, 5, and 6, is normal to the plane mentioned above.

Such a condition is identified by making reference to the main optical x-y-z axes of the crystalline materials used.

As is known, such axes are the axes along which the fields E and D of an electromagnetic wave which is propagated in the crystal are parallel. They form an orthogonal 3-axis system and are always unambiguously defined in any anisotropic material.

The crystals which satisfy the above condition may be identified by their having a particular crystal structure and by their belonging to a particular given symmetry group, identified according to international convention.

Crystals suitable for the purpose can be selected from:

monoclinic crystals: class 2 y-cut and z-cut;
orthorhombic: class 222 x-cut, y-cut, z-cut and class 2 mm z-cut;
tetragonal: class 4 z-cut, class $\bar{4}$ z-cut, class 422 x-cut and y-cut, class 4 mm z-cut, class $\bar{4}2$ m x-cut, y-cut or z-cut;
rhombohedral: class 32 x-cut;
hexagonal: class 622 x-cut or y-cut, class $\bar{6}$ m2 x-cut or y-cut;
cubic: class $\bar{4}3$ m x-cut, y-cut or z-cut and class 23 x-cut, y-cut or z-cut.

The indicated cutting planes (x-cut, y-cut, z-cut) are the planes for which the corresponding direction of optical propagation is normal to the plane, and the crystals must be oriented inside the sensor so that the arrangement of such planes is appropriate in relation to the direction of the measurement light.

For the cubic crystals mentioned above, the cutting plane, that is the plane containing the face 11a and on which the optical measurement signal is made to impinge orthogonally, can be normal to any of the x-, y- or z-directions (that is, it is a plane having Miller indices (100), (010), (001), respectively), while for the tetragonal crystals in classes 4, $\bar{4}$ and 4 mm only the z-plane is acceptable. In class 422, the planes x and y, and in class $\bar{4}2$ m, the planes x, y and z are acceptable.

With the orthorhombic crystals in class 222, the acceptable cutting planes are those defined by the three directions x, y and z, while in class 2 mm, only the plane normal to the z-direction is acceptable. For rhombohedral crystals, the cutting plane which may be used is the plane normal to the x-axis. For hexagonal crystals, the plane normal to the x- or the y-axis and for monoclinic crystals, the plane normal to the y- or the z-axis is acceptable.

Among the above-mentioned crystalline groups the following are preferred:

Monoclinic:

class 2: $Ca_2Nb_2O_7$

Orthorhombic:

class 222: $KNa(C_4H_4O_6).H_2O$ (Rochelle salts)

class 2 mm: $LiB_3O_5$, $KB_5O_8.H_2O$ and isomorphous compounds

Tetragonal:

class 4 mm: $BaTiO_3$;

class $\bar{4}2$ m: $KH_2PO_4$ and isomorphous compounds (also known as KDP)

Rhombohedral:

class 32: $SiO_2$ (quartz)

Hexagonal:

class $\bar{6}$ m2: GaSe, $\alpha$-ZnS, CdS, CdSe

Cubic:

class 23: $Bi_{12}GeO_{20}$ and isomorphous compounds class $\bar{4}3$ m: $Bi_4Ge_3O_{12}$ and isomorphous compounds; CdTe, GaAs, GaP, $\beta$-ZnS, ZnTe, CuCl, CuBr.

Crystals suitable for use in the probe are crystals exhibiting the required conditions and must also be substantially transparent to light having the wavelength used for the measurement signal.

Thus the crystals should preferably have a half-length of the luminous intensity inside them not less than the length of the optical path within the crystal in the probe. In some applications, however, crystals with an attenuation higher than this value may be used, provided that the output intensity of the crystal is sufficient for the measurement.

As an example, an x-cut cubic crystal is represented diagrammatically in FIG. 4, wherein the cutting plane 11a is normal to the x-direction and the direction of propagation of the signal is parallel to the x-axis.

In combination with such a crystal 11, the polarizer 9 is arranged with the polarization axis, indicated by the arrow P, oriented in a direction parallel to the x- or y-axis, that is, at 45° to the orthogonal axes along which the refraction indices of crystal 11 are modified by the desired component $E_x$ of the electric field.

In the case of a cubic crystal, a y-cut or z-cut crystal would be appropriate for the measurement of the field component parallel to the corresponding y or z direction of propagation of light in the crystal.

As an alternative, using for example a GaSe crystal (hexagonal $\bar{6}$ m2), with m perpendicular to the y-axis and with the direction of the propagation of the light in the crystal parallel to y (y-cut), as illustrated in FIG. 5, it is possible to measure the x-component ($E_x$) of the field, normal to the propagation direction, by arranging the polarizer with the polarization axis P oriented at 45° to x and z.

Such a configuration is useful, for example, where the shape of the probe presents problems in its positioning in the measurement area, since its sensitivity in the direction orthogonal to the larger dimension of the probe can be exploited.

In a further example, illustrated in FIG. 6, a crystal of quartz ($SiO_2$) (rhombohedral, class 32), or gallium selenide (GaSe) (hexagonal, class $\bar{6}$ m2) is used. In either case, the end face 11a is perpendicular to the x-axis, that is, the crystal is x-cut.

The polarizer 9 is arranged with the polarization axis P at 45° to the y- and z-axes, and the field component measured is the component $E_x$, along the x-axis.

The delay plate 10 serves to introduce a phase shift between two orthogonal polarizations and is used with its birefringence axes at 45° to the polarization plane.

The response of the sensor is dependent on the phase shift produced by the plate and thus, by means of the plate 10, it is possible to impart a constant phase shift, which is added to the variable shift introduced by the measured electric field, which will permit operation near a desired value of electric field, such as in a linear area of the response curve.

In view of the substantially cosinusoidal shape of the response curve of a polarimetric probe, if it desired to operate in a linear response region near a zero average value of the field, the shift to be introduced is equal to one quarter wavelength. In the reflection probe of FIGS. 2 and 3, the plate 10 is traversed twice by the measurement signal, and it is thus arranged to produce a shift of one eighth of a wavelength for each passage, so that, after two successive passages, the over-all phase shift is the desired quarter wavelength.

In the non-reflective sensor of FIG. 1, wherein the delay plate 10 is traversed only once by the measurement signal, in order to operate near a zero field value, a plate providing a phase shift of a quarter wavelength is used.

In cases where the probe has to operate in the presence of different field values, the material and the thickness of the delay plate is selected so as to obtain the desired phase shift in accordance with known techniques.

The delay plate, irrespective of the phase shift, is formed from birefringent material. In order to obtain a directional sensor, such a plate is formed either from non-electro-optical anisotropic birefringent material, e.g. mica, with two axes of linear birefringence perpendicular to the direction of propagation and at 45° to the axis of polarization, or from an electro-optical anisotropic birefringent material, the birefringence characteristics of which are modified by the same field component (and only by that one) which has an effect on the probe crystal.

When the plate is formed from non-electro-optical material, its orientation has no influence on the directionality of the sensor.

When, on the other hand, an electro-optical material is used, this may be selected from the following crystalline classes:

Tetragonal:
class 4 and $\bar{4}$ (z-cut)
Orthorhombic:
class 2 mm (z-cut)
Rhombohedral:
class 32 (x-cut)
Hexagonal:
class $\bar{6}$ m2 (x-cut or y-cut).

A preferred material for the delay plate is x-cut quartz.

Birefringence induced on the x-cut quartz by an electric field E in the x-direction produces a variation in the refractive indices of the main axes y, z which thus produces a phase delay modulated by the electric field. If the main axes of a delay plate of such material are parallel to the induced birefringence axes of the sensitive crystal 11, such phase delay is added to that produced by the field itself on the crystal, contributing to the sensitivity of the probe in the desired direction, without other field components being detected.

For such conditions, the plate is oriented with its birefringence axes at 45° to the axis of polarization P.

For crystals 11 which measure the field component in the direction of propagation of the optical measurement signal and in which the induced birefringence is at 45° to the axes, the y- and z axes of the quartz delay plate must be oriented at 45° to the main optical axes of the crystal 11, such as, for example, in the case of the cubic crystal represented in FIG. 4.

In the case where the induced birefringence is along the main axes (FIG. 6), the axes of the delay plate must be aligned with these, and the axis P of the polarizer must be at 45° to both (say, with GaSe x-cut).

The use of a probe containing a delay plate with a different orientation, or with materials other than those discussed above, introduces a directionality defect in the sensor, that is, a sensitivity to field components in addition to the one desired, which may range from 10% to 100% of the disired component itself. Thus, for many uses, such as the measurement of the field configuration around a high-voltage body or device, in which not only the magnitude of the field but also its direction is unknown, it is appropriate that the delay plate also satisfy the above criteria of directionality, since an error in the measurement could lead to unacceptable results.

As illustrated in FIG. 3, a sensor suitable for measuring a component of the electric field has been fabricated using a crystal of bismuth germanate ($Bi_4Ge_3O_{12}$, cubic, class $\bar{4}3$ m, also known as BGO), having a prismatic shape of length 10 mm and cross-section $3 \times 3$ mm. The crystal has been cut so that the larger dimension is in the z-direction, while the smaller sides are in the x- and y-directions (referred to the main optical axes), as highlighted by the reference axes in the figure.

The measurement signal is transmitted into the crystal along the z-direction of the crystal.

The delay plate is made from x-cut quartz of 1 mm thickness and a cross-section of $3 \times 3$ mm. The y- and z-axes of the plate are at 45° to the x- and y-axes of the BGO crystal.

The polarizer is made from glass of 1 mm thickness and a cross-section of $3 \times 3$ mm. The polarization axis is parallel to one of the x- or y-axes of the BGO crystal (at 45° to the y- and z-axes of the quartz plate).

The light constituting the measurement signal is transmitted to the probe via a fiber 2 of the multimode 50/125 type and is focused by a lens 8 having a variable refractive index and a diameter of 2 mm.

The probe casing is made entirely from dielectric material.

The sensitivity of the probe is such that it is possible, in combination with suitable known emission, reception and signal processing devices to measure electric fields in air ranging from a few V/mm to a few kV/mm, at frequencies ranging from that of the mains voltage (<50 Hz) to atmospheric impulses (>500 kHz), with a directional error of less than 1%.

A probe of the above structure is thus sensitive to a single field component, parallel or normal to the direction of propagation of the optical measurement signal, which conveniently coincides with the probe's longitudinal axis. Thus, if the probe itself is placed in an unknown electric field and oriented in a pre-determined direction, it is possible to obtain an indication of the component of the electric field in that direction.

Figure 7:
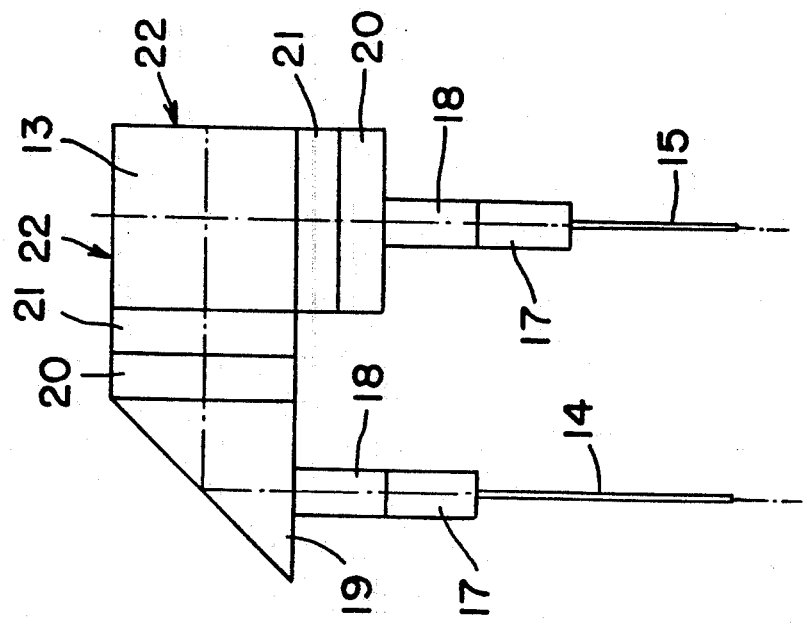
in FIG. 7 a side view of the probe of a sensor sensitive to several components of the field.

If the probe is subsequently oriented in another direction, or if it is placed in a new position, it is then possible to measure the field in such new direction or position, until the configuration of the desired field is established in relation to the specific measurement requirements.

Where it is desired to establish simultaneously, with a single probe, the value of all the vector components of the field, it is convenient to use a probe of the type shown in FIG. 7, in side view, and in exploded view in FIG. 8. In such a probe, an electro-optical crystal 13, having a cubic shape, receives from three independent fibers 14, 15, 16 respective measurement signals at three mutually orthogonal faces. Each fiber is housed in a respective ferrule 17, and the emergent beam of light is collimated by a respective lens 18.

In order for the fibers 14, 15, 16 to be parallel to one another at their points of connection to the probe, two of them may conveniently be provided with a respective prism 19, suitable for deviating the beam of light through 90°.

Thus, there is, in the optical path of the signal emitted by each fiber a respective polarizer 20 and a delay plate 21, while the faces of the crystal 13 opposite to the ones receiving the measurement signals are provided with respective reflective coatings 22.

With such a structure, there are measurement signals in the three directions inside the crystal 13, whereby it is possible to obtain the complete configuration of the field using a probe having particularly small dimensions, but which introduces limited disturbances into the measured field and which also measures the three components at a single point, thus ensuring the necessary accuracy.

In order to perform the measurement in the three directions the crystal 13 must be an electro-optical crystal (i) which is transparent at the wavelength(s) of the measurement signals, as described above, (ii) for which there are three mutually orthogonal directions and (iii) for which the condition of directionality obtains, so that the crystalline structure provides for each such direction a corresponding plane in which the modification of the refraction characteristics along two orthogonal axes lying in the plane is caused by only one component of the field and so that for each direction of propagation three independent field components are measured. Crystals suitable for the purpose are:

Cubic:
class $\bar{4}3$ m and 23 (x-cut, y-cut, z-cut)
Orthorhombic:
class 222 (x-cut, y-cut, z-cut)
Tetragonal:
class $\bar{4}2$ m (x-cut, y-cut, z-cut)

Preferably, crystals for three-directional sensors are cubic crystals of classes $\bar{4}3$ m and 23; such crystals are not naturally birefringent and have equal sensitivity along the three axes.

If measurements of only two field vector components are desired, that is, if a two-directional probe is desired, the probe can have a structure similar to that represented, and the same materials may be used for the crystals 13, but with one of the fibers and the corresponding polarizer and delay plate removed.

In all such one-, two- or three-directional sensors, the crystal's cutting plane preferably has a tolerance lower than 5/10ths of a degree with respect to the theoretical crystallographic plane, and an equal tolerance is required for the direction of incidence of the optical signal with respect to such plane. This ensures an error in the measurement of directionality of the order of 1 to 2%, that is, the sensitivity to field components other than the desired one is equal to 1 to 2% of the sensitivity in the correct direction, which is acceptable for the majority of uses without imposing undue difficulties in the manufacture of the crystal.

In order to obtain greater measurement accuracy, with a directionality error of less than 0.1 to 0.3%, a cutting tolerance of the surface and of the optical signal's angle of incidence, such as to permit an angular error of less than 6; must be adopted.

For the axis of polarization of polarizer 9, a modest error of inclination does not affect directionality to an appreciable extend; a commonly applied tolerance value ranges from 0.1° to 1°.

Many variations of the above sensors may be introduced, without departing from the scope of the present invention.

I claim:

1. In a polarimetric directional electric field sensor comprising:
    a measurement signal emitter;
    a measurement signal receiver;
    a manoeuverable probe comprising an optical sensitive element for modifying the state of polarization of an optical signal transmitted therethrough in the presence of a field to be measured, and means for polarizing the measurement signal; and
    at least one optical fiber connecting the probe to the emitter and to the receiver, wherein the improvement is that:
    said optically sensitive element comprises an electro-optical crystal having a crystalline structure which provides a plane in which the change of the refraction characteristics along two orthogonal axes lying therewithin is caused to be determined by a single component of the electric field, the crystal being cut and oriented in the probe so that the direction of propagation of the measurement signal therein is normal to said plane; and
    said polarizing means is oriented at 45° to said orthogonal axes along which the refractive indices of said electro-optical crystal are modified by said single component of the electric field.

2. A polarimetric directional electric field sensor according to claim 1 wherein said probe comprises a casing, at least one collimnating means, a polarizer and said electro-optical crystal in said casing in alignment with each other and wherein said fiber has an end thereof within said casing, said crystal having a pair of oppositely facing faces, one of said faces facing said end of said fiber and the other of said faces having reflecting means for reflecting an optical signal emitted from said end of said fiber.

3. In a polarimetric directional field sensor, comprising a measurement signal emitter (1), a measurement signal receiver (1), a manoeuverable probe (3), optical fibers (2, 2a, 2b) connecting the probe (3) to the emitter and to the receiver, wherein the probe comprises an optically sensitive element (11, 13) for modifying the state of polarization of an optical signal transmitted therethrough in the presence of a field to be measured, and means (9, 20) for polarizing the measurement signal, wherein the improvement is that the optically sensitive element (11, 13) comprises an electro-optical crystal having a crystalline structure which provides a plane in which the change of the refraction characteristics along two orthogonal axes lying therewithin is caused to be determined by a single component of the field, the crystal being cut and oriented in the probe so that the direction of propagation of the measurement signal therein is normal to said plane, and said polarizing means (9, 20) is oriented at 45° to the orthogonal axes along which the crystal's refractive indices are modified by the desired component of the field, said electro-optical crystal being selected from the crystals:

monoclinic; class 2 y-cut z-cut;
orthorhombic: class 222 x-cut, y-cut, z-cut and class 2 mm z-cut;
tetragonal: class 4 z-cut, class $\bar{4}$ z-cut, class 422 x-cut and y-cut, class 4 mm z-cut, class $\bar{4}2$ m x-cut, y-cut or z-cut;
rhombohedral: class 32 x-cut; - hexagonal: class 622 x-cut or y-cut, class om2 x-cut or y-cut;
cubic: class $\bar{4}3$ m x-cut, y-cut or z-cut and class 23, x-cut, y-cut or z-cut, with the corresponding cutting plane oriented orthogonally to the direction of propagation of the optical measurement signal inside the crystal.

4. A polarimetric directional field sensor according to claim 3, characterised in that the electro-optical crystal is selected from the group comprising $Ca_2Nb_2O_7$; $KNa(C_4H_4O_6) \cdot 4H_2O$; $LiB_3O_5$, $KB_5O_8 \cdot 4H_2O$ and isomorphous compounds; $BaTiO_3$; $KH_2PO_4$ and isomorphous compounds; $SiO_2$; $GaSe$; $\alpha$-$ZnS$; $CdS$; $CdSe$; $Bi_{12}GeO_{20}$ and isomorphous compounds; $Bi_4Ge_3O_{12}$ and isomorphous compounds; $CdTe$; $GaAs$; $GaP$; $\beta$-$ZnS$; $ZnTe$; $CuCl$.

5. A polarimetric directional field sensor according to claim 3, characterised in that the crystal is a cubic crystal of class $\bar{4}3$ m or class 23, x-cut, y-cut or z-cut, the direction of propagation of the signal is parallel to the x-axis and the polarizer is arranged with its polarization plane oriented in a direction parallel to the y- or z-axes of the crystal, the sensor being sensitive to the x-component ($E_x$) of the field, parallel to the direction of propagation of the light in the crystal.

6. A polarimetric directional field sensor, comprising a measurement signal emitter (1), a measurement signal receiver (1), a manoeuvrable probe (3), optical fibers (2, 2a, 2b) connecting the probe (3) to the emitter and to the receiver, wherein the probe comprises an optically sensitive element (11, 13) for modifying the state of polarization of an optical signal transmitted therethrough in the presence of a field to be measured, and means (9, 20) for polarizing the measurement signal, characterized in that the optically sensitive element (11, 13) comprises an electro-optical crystal having a crystalline structure which provides a plane in which the change of the refraction characteristics along two orthogonal axes lying therewithin is caused to be determined by a single component of the field, the element being cut and oriented in the probe so that the direction of propagation of the measurement signal therein is normal to said plane, the polarizing means (9, 20) being oriented at 45° to the orthogonal axes along which the crystal's refractive indices are modified by the desired component of the field and characterized in that the probe comprises a delay plate made from birefringent material and positioned in the path of the optical measurement signal, and arranged for imparting a constant predetermined phase shift between two orthogonal polarizations of the optical measurement signal, the delay plate being oriented with its optical birefrinence axes substantially at 45° to the plane of polarization.

7. A polarimetric directional field sensor according to claim 6, characterized in that the delay plate is formed from non-electro-optical birefringent material.

8. A polarimetric directional field sensor according to claim 6, characterized in that the delay plate is made from electro-optical birefringent material and is oriented so that its birefringence characteristics are changed by the same field component to which the electro-optical crystal is sensitive.

9. A polarimetric directional field sensor according to claim 8, characterized in that the delay plate is made from electro-optical anisotropic birefringent material, selected from crystals:

tetragonal: class 4 and 4, z-cut;
orthorhombic: class 2 mm, z-cut;
rhombohedral: class 32, x-cut;
hexagonal: class om2, x-cut, y-cut.

10. A polarimetric directional field sensor according to claim 9, characterized in that the material is x-cut quartz.

11. A polarimetric directional field sensor according to claim 5 or claim 8, characterized in that the crystal has a birefringence induced at 45° to the main optical axes and each optical measurement signal is propagated parallel to the respective component of the field to be measured, and the delay plate is oriented with the y- and z-axes at 45° to the main optical axes of the birefringent crystal.

12. A polarimetric directional field sensor, comprising a measurement signal emitter (1), a measurement signal receiver (1), a manoeuvrable probe (3), optical fibers (2, 2a, 2b) connecting the probe (3) to the emitter and to the receiver, wherein the probe comprises an optically sensitive element (11, 13) for modifying the state of polarization of an optical signal transmitted therethrough in the presence of a field to be measured, and means (9, 20) for polarizing the measurement signal, characterized in that the optically sensitive element (11, 13) comprises an electro-optical crystal having a crystalline structure which provides three incident planes in each of which the change of the refraction characteristics along two orthogonal axes lying in the same plane is caused to be determined by a single component of the field, independent of the other components of the field, said probe comprises means for transmitting into the crystal and for receiving therefrom at least two independent optical measurement signals, the directions of propagation of which are normal to respective ones of said planes, the polarizing means (9, 20) being oriented at 45° to the orthogonal axes along which the crystal's refractive indices are modified by the desired component of the field.

13. A polarimetric directional field sensor according to claim 12, characterized in that the electro-optical crystal is selected from crystals:

cubic: classes $\bar{4}3$ m and 23 x-cut, y-cut, z-cut;
orthonormal: class 222 x-cut, y-cut, z-cut;
tetragonal: class $\bar{4}2$ m x-cut, y-cut, z-cut;

with the corresponding cutting planes oriented orthogonally to the direction of propagation of the optical measurement signal inside the crystal.

14. A polarimetric directional field sensor according to claim 13, characterized in that the electro-optical crystal is a cubic crystal of the class $\bar{4}3$ m or 23.

15. A polarimetric directional field sensor according to claim 12, characterized in that the probe comprises a casing the ends of at least two of said optical fibers are received in said casing and respective collimnating means for said fiber, one of which fibers being oriented orthogonally to one of the planes of the electro-optical crystal and the other fiber or fibers being parallel to said one fiber and aligned with respective prisms for deviating the optical signals transmitted thereby towards the corresponding planes of the crystal, the three planes of the crystal to which the optical signals are directed being mutually orthogonal.

16. A polarimetric directional field sensor, comprising a measurement signal emitter (1), a measurement signal receiver (1), a manoeuverable probe (3), optical fibers (2, 2a, 2b) connecting the probe (3) to the emitter and to the receiver, wherein the probe comprises an optically sensitive element (11, 13) for modifying the state of polarization of an optical signal transmitted therethrough in the presence of a field to be measured, and means (9, 20) for polarizing the measurement signal, characterized in that the optically sensitive element (11, 13) comprises an electro-optical crystal having a crystalline structure which provides a plane in which the change of the refraction characteristics along two orthogonal axes lying therewithin is caused to be determined by a single component of the field, the element being cut and oriented in the probe so that the direction of propagation of the measurement signal therein is normal to said plane, the polarizing means (9, 20) being oriented at 45° to the orthogonal axes along which the crystal's refractive indices are modified by the desired component of the field, said electro-optical crystal being $\bar{6}$ m2, with m $\perp$ y, y-cut, and the polarizer being arranged with the polarization axis at 45° to the x- and y-axes of the crystal, the sensor being sensitive to the x-component ($E_x$) of the field, normal to the direction of propagation of the light in the crystal.

17. A polarimetric directional field sensor according to claim 16 or claim 14, characterized in that the crystal has a birefringence induced along its main optical axes and the delay plate is oriented with type y- and z-axes along the main optical axes of the birefringent crystal.

18. A polarimetric directional field sensor, comprising a measurement signal emitter (1), a measurement signal receiver (1), a manoeuverable probe (3), optical fibers (2, 2a, 2b) connecting the probe (3) to the emitter and to the receiver, wherein the probe comprises an optically sensitive element (11, 13) for modifying the state of polarization of an optical signal transmitted therethrough in the presence of a field to be measured, and means (9, 20) for polarizing the measurement signal, characterized in that the optically sensitive element (11, 13) comprises an electro-optical crystal having a crystalline structure which provides a plane in which the change of the refraction characteristics along two orthogonal axes lying therewithin is caused to be determined by a single component of the field, the element being cut and oriented in the probe so that the direction of propagation of the measurement signal therein is normal to said plane, the polarizing means (9, 20) being oriented at 45° to the orthogonal axes along which the crystal's refractive indices are modified by the desired component of the field, said electro-optical crystal being rhombohedral crystal 32 x-cut, or hexagonal $\bar{6}$ m2, with m $\perp$ y, x-cut, and the polarizer is arranged with the axis of polarization oriented at 45° to the y- and z-axes of the crystal, the sensor being sensitive to the x-component ($E_x$) of the field, parallel to the direction of propagation of the light in the crystal.

19. A polarimetric directional electric field sensor comprising:
  a measurement signal emitter;
  a measurement signal receiver;
  a manoeuverable probe; and
  at least one optical fiber connecting the probe to the emitter and to the receiver, wherein said probe comprises:
  an optically sensitive element for modifying the state of polarization of an optical signal transmitted therethrough in the presence of an electric field to be measured comprising an electro-optical crystal having a crystalline structure which provides a plane in which the change of the refraction characteristics along two orthogonal axes lying therewithin is caused to be determined by a single component of the electric field, the crystal being cut and oriented in the probe so that the direction of propagation of the measurement signal therein is normal to said plane and the cutting plane of the electro-optical crystal has an orientational tolerance of less than 5/10ths of a degree with respect to the prescribed theoretical plane; and
  polarizing means for polarizing the measurement signal, said means being oriented at 45° to said orthogonal axes along which the refractive indices of said electro-optical crystal are modified by said single component of the electric field.

20. A polarimetric directional field sensor according to claim 19 characterized in that the cutting plane of the electro-optical crystal has an orientational tolerance of less than 6° with respect to the prescribed theoretical plane.

21. A polarimetric directional electric field sensor comprising:
  a measurement signal emitter;
  a measurement signal receiver;
  a manoeuverable probe; and
  at least one optical fiber connecting the probe to the emitter and to the receiver, wherein said probe comprises:
  an optically sensitive element for modifying the state of polarization of an optical signal transmitted therethrough in the presence of an electric field to be measured comprising an electro-optical crystal having a crystalline structure which provides a plane in which the change of the refraction characteristics along two orthogonal axes lying therewithin is caused to be determined by a single component of the electric field, the crystal being cut and oriented in the probe so that the direction of propagation of the measurement signal therein is normal to said plane; and
  polarizing means for polarizing the measurement signal, said means being oriented at 45° to said orthogonal axes along which the refractive indices of said electro-optical crystal are modified by said single component of the electric field, the plane of polarization of said polarizing means has an orientational tolerance of less than 1° with respect to the prescribed theoretical plane.

* * * * *

UNITED STATES PATENT AND TRADEMARK OFFICE
CERTIFICATE OF CORRECTION

PATENT NO. : 5,272,433  
DATED : December 21, 1993  
INVENTOR(S) : Simonelli

Page 1 of 2

It is certified that error appears in the above-indentified patent and that said Letters Patent is hereby corrected as shown below:

TITLE PAGE

Item [54] and column 1, line 3, insert --AND-- after "CUT";

[73] the name of the assignee should be "Cavi";

Col. 1, line 52, after "emitter" a comma (,) should be inserted;

Col. 2, line 14, the semi-colon (;) should be a colon (:);

Col. 3, line 39, "which" (first occurrence) should read --with a--;

Col. 3, line 66, "schematic a" should read --a schematic--;

Col. 4, line 8, omit the comma (,);

Col. 10, line 13, "6;" should read --6'--;

Col. 10, line 16, "extend" should read --extent--;

UNITED STATES PATENT AND TRADEMARK OFFICE
CERTIFICATE OF CORRECTION

PATENT NO. : 5,272,433
DATED : December 21, 1993
INVENTOR(S) : Simonelli

It is certified that error appears in the above-indentified patent and that said Letters Patent is hereby corrected as shown below:

Col. 12, line 16, "4" (second occurrence) should read --$\overline{4}$--.

Signed and Sealed this

Twenty-first Day of June, 1994

*Attest:*

BRUCE LEHMAN

*Attesting Officer*   *Commissioner of Patents and Trademarks*